United States Patent
Sakurai

(10) Patent No.: US 6,309,738 B1
(45) Date of Patent: Oct. 30, 2001

(54) HARD MULTILAYER COATED TOOL HAVING INCREASED TOUGHNESS

(75) Inventor: Masatoshi Sakurai, Toyokawa (JP)

(73) Assignee: OSG Corporation, Toyokawa (JP)

( * ) Notice: Subject to any disclaimer, the term of this patent is extended or adjusted under 35 U.S.C. 154(b) by 0 days.

(21) Appl. No.: 09/380,702

(22) PCT Filed: Dec. 18, 1998

(86) PCT No.: PCT/JP98/05763

§ 371 Date: Sep. 8, 1999

§ 102(e) Date: Sep. 8, 1999

(87) PCT Pub. No.: WO99/40233

PCT Pub. Date: Aug. 12, 1999

(30) Foreign Application Priority Data

Feb. 4, 1998 (JP) .................................................. 10-22997
Jul. 6, 1998 (JP) .................................................. 10-190114

(51) Int. Cl.[7] .................................................................. B32B 7/00
(52) U.S. Cl. .................. 428/216; 51/295; 51/307; 51/309; 407/119; 428/212; 428/336; 428/697; 428/698; 428/699
(58) Field of Search ..................................... 428/697, 698, 428/699, 216, 212, 336; 51/295, 307, 309; 407/119

(56) References Cited

U.S. PATENT DOCUMENTS

| | | | |
|---|---|---|---|
| 4,753,854 | * | 6/1988 | Gavrilov et al. ..................... 428/698 |
| 4,842,710 | * | 6/1989 | Freller et al. ..................... 204/192.38 |
| 5,208,102 | * | 5/1993 | Schulz et al. ......................... 428/698 |
| 5,330,853 | * | 7/1994 | Hofmann et al. ..................... 428/697 |
| 5,366,564 | * | 11/1994 | Yamagata et al. .................... 148/403 |
| 5,503,912 | | 4/1996 | Setoyama et al. . |
| 5,656,383 | * | 8/1997 | Tanaka et al. ......................... 428/697 |
| 5,679,448 | * | 10/1997 | Kawata ................................. 428/697 |
| 5,882,777 | * | 3/1999 | Kukino et al. ......................... 428/699 |
| 5,882,778 | * | 3/1999 | Sugizaki et al. ....................... 428/216 |
| 5,981,049 | * | 11/1999 | Ohara et al. ........................... 428/216 |
| 6,110,571 | * | 8/2000 | YaginumA et al. ................... 428/699 |

FOREIGN PATENT DOCUMENTS

| | | |
|---|---|---|
| 0 496 053 A1 | 11/1991 | (EP) . |
| 0 701 982 A1 | 3/1996 | (EP) . |
| 0 709 483 A2 | 5/1996 | (EP) . |
| B2-4-53642 | 8/1992 | (JP) . |
| B2-5-67705 | 9/1993 | (JP) . |
| 7-97679 | 4/1995 | (JP) . |

* cited by examiner

Primary Examiner—Archene Turner
(74) Attorney, Agent, or Firm—Oliff & Berridge, PLC

(57) ABSTRACT

A hard multilayer coated tool including: (a) a substrate; and (b) a multilayer coating covering the substrate, the multilayer coating comprising first and second coating layers which are alternately laminated on the substrate, each of the first coating layers having and average thickness of 0.10–0.50 μm and containing titanium therein, each of the second coating layers having and average thickness of 0.10–0.50 μm and containing aluminum therein, the multilayer coating having and average thickness of 0.50–10.0 μm.

19 Claims, 2 Drawing Sheets

HARD MULTILAYER COATED TOOL HAVING INCREASED TOUGHNESS

TECHNICAL FIELD

The present invention relates in general to a hard multilayer coated tool which includes a substrate made of a high-speed tool steel, cemented carbide, cermet or CBN sintered body, and a hard multilayer coating covering the substrate.

BACKGROUND ART

Conventionally, for the purpose of increasing the wear resistance of a tool which is made of high-speed tool steel, cemented carbide, cermet or CBN sintered body, the tool is covered with a hard coating formed of a nitride, carbide or carbon-nitride of Ti, Cr, Hf or Zr, by a physical vapor deposition method (PVD method), a chemical vapor deposition method (CVD method), or other suitable method, such that the hard coating has the average thickness of 0.50–10.0 μm. In recent years, for the purpose of increasing the rust or oxidation resistance of the hard coating so as to satisfy the requirement for increased cutting velocity, there has been widely used a tool which is formed by covering the substrate or base material made of a cemented carbide with a hard coating of AlTiN or AlTiCN by the PVD method. For example, JP-B2-4-53642 discloses a hard coating which has a thickness of 0.50–10.0 μm and which is formed of a composite solid solution of carbide, nitride or carbon nitride of Al and Ti. Further, JP-B2-5-67705 discloses a hard coating which has a thickness of 0.80–10.0 μm and which is formed of a wear resistant coating having a chemical composition wherein the content of aluminum is in a range of 56–75%, in an attempt to further increase the heat resistance of the hard coating. Still further, JP-A-7-97679 discloses a hard multilayer coating which has a total thickness of 0.50–10.0 μm and a stoichiometrically aluminum-rich bulk composition, wherein titanium-rich ultra thin AlTiN layers and aluminum-rich ultra thin AlTiN layers are alternately superposed on each other such that the pitch or spacing interval between the adjacent tanium-rich ultra thin AlTiN layers, or between the adjacent aluminum-rich ultra thin AlTiN layers is in a range of 0.50–20.0 nm (nanometer).

In recent years, the required cutting velocity has been further increased while the work material to be cut has become harder. Where the conventional coated tool is used for cutting the harder work material at a required high cutting velocity, the coating of the tool tends to be slightly broken or chipped instead of being worn. Particularly, the aluminum-rich AlTiN coating is easily chipped due to its high hardness of 2600 Hv or more. Thus, the conventional coated tool does not exhibit the desired degree of wear resistance, irrespective of whether the tool is covered by a coating constituted by a single layer, a coating constituted by a plurality of layers, or a coating constituted by layers each having a considerably small thickness. The coating of the tool tends to be chipped more easily when the hardness of the coating is relatively high, so that the tool with the hard coating is not capable of exhibiting an expected or satisfactory degree of wear resistance.

DISCLOSURE OF INVENTION

The present invention was developed under the above-described background situation and has an object of providing a hard multilayer coated tool which has an outstandingly improved toughness (the opposite condition to brittleness) while assuring a high heat resistance without deteriorating the wear resistance.

The above object may be achieved by the principle of the present invention which is a hard multilayer coated tool comprising: (a) a substrate; and (b) a multilayer coating covering the substrate, the multilayer coating comprising first and second coating layers which are alternately laminated on the substrate, each of the first coating layers having an average thickness of 0.01–0.50 μm and containing titanium therein, each of the second coating layers having an average thickness of 0.01–0.50 μm and containing aluminum therein, the multilayer coating having an average thickness of 0.50–10.0 μm.

The hard multilayer coating according to the present invention is formed through ion plating method, sputtering method or other physical vapor deposition method (PVD method), or alternatively, plasma CVD, heat CVD or other chemical vapor deposition method (CVD method). Where the hard multilayer coating of the present invention is formed through the ion plating method, the ionized metal component is reacted in a furnace under $N_2$ atmosphere or $CH_4$ atmosphere. The hard multilayer coating is obtained by using a target made of an alloy including titanium and a target made of an alloy including aluminum. The two targets are alternately activated to serve as the cathode, so that the first and second coating layers are alternately laminated on the substrate, namely, whereby the first and second coating layers are alternately superposed on each other. The compositions of the two targets correspond to those of the first and second coating layers.

The material of the substrate may be any one of various tool materials such as high speed tool steel, cemented carbide, cermet and CBN sintered body. It is preferable that one of the first coating layers constitute an innermost layer of the multilayer coating, and that one of the coating layers other than the first coating layers constitute an outermost layer of the multilayer coating which is remote from the substrate.

If the first coating layer, which has a relatively low degree of hardness due to the absence of aluminum in the first coating layer or due to the lower percentage content of aluminum in the first coating layer than in the second coating layer, has a thickness of less than 0.01 μm, the multilayer coating is not capable of absorbing an impact applied thereto when the tool is in process of machining or cutting the work material. If the first coating layer has a thickness of more than 0.50 μm, on the other hand, the wear resistance and the heat resistance of the entirety of the multilayer are undesirably reduced. Further, if the second coating layer, which has a relatively high degree of hardness due to the content of aluminum in the second coating layer or due to the higher percentage content of aluminum in the second coating layer than in the first coating layer, has a thickness of less than 0.01 μm, the multilayer coating is not capable of exhibiting a sufficient wear resistance. If the second coating layer has a thickness of more than 0.50 μm, on the other hand, the second coating layer is inevitably broken or chipped even where the second coating layer is interposed between the first coating layers which absorb the impact applied to the multilayer coating. Therefore, the thickness of each coating layer is limited to range from 0.01 to 0.50 μm.

According to a first aspect of the present invention, the each of the first coating layers has a composition represented by $(Al_X Ti_{1-X})(N_Y C_{1-Y})$ wherein $0.05 \leq X \leq 0.50$, $0.50 \leq Y \leq 1.00$, while the each of the second coating layers has a composition represented by $(Al_Z Ti_{1-Z})(N_T C_{1-T})$ wherein $0.50 < Z \leq 0.80$, $0.50 \leq T \leq 1.00$.

According to a first preferred form of the first aspect of the present invention, the multilayer coating has a stoichiometrically aluminum-rich bulk composition.

The aluminum-rich stoichiometric composition in the entirety of the multilayer coating leads to satisfaction in the following expression (1), wherein X, Z represent the mixing ratio of aluminum in the respective first and second coating layers; $l_1$ represents the average thickness of the first coating layer; and $l_2$ represents the average thickness of the second coating layer.

$$(Xl_1+Zl_2)/(l_1+l_2)>0.5 \quad (1)$$

According to a second aspect of the present invention, the each of the first coating layers has a composition represented by $Ti(N_x C_{1-x})$ wherein $0.50 \leq x \leq 1.00$, while the each of the second coating layers has a composition represented by $(Al_y Ti_{1-y})(N_z C_{1-z})$ wherein $0.20 \leq y \leq 0.80$, $0.50 \leq z \leq 1.00$.

If the second coating layer has an aluminum content of less than 20%, the multilayer coating does not exhibit sufficient heat resistance and hardness. If the second coating layer has an aluminum content of more than 80%, on the other hand, the multilayer coating does not exhibit a sufficient hardness. Therefore, the aluminum content of the second coating layer is limited to range from 0.20 to 0.80%.

According to a first preferred form of the second aspect of the present invention, the average thickness of the each of the first coating layers is 0.01–0.40 μm, and the average thickness of the each of the second coating layers is 0.01–0.40 μm.

In the hard multilayer coated tool constructed according to the present preferred form, the high degree of wear resistance and the high degree of heat resistance of the multilayer are further assured while the second coating layer is further assuredly prevented from being chipped.

According to a third aspect of the present invention, the hard multilayer coated tool further comprises an interface layer which contains titanium therein and which is interposed between the substrate and the multilayer coating.

In the hard multilayer coated tool constructed according to the third aspect of the present invention, the interface layer, which is made of TiN, for example, is provided between the substrate and the multilayer coating, for increasing the adhesiveness of the multilayer coating with the substrate.

According to a fourth aspect of the present invention, the hard multilayer coated tool further comprises a surface layer which contains aluminum therein and which is superposed on an outer surface of the multilayer coating.

According to a fifth aspect of the present invention, the above-described multilayer coating further comprises intermediate coating layers each of which is interposed between the first and second coating layers, and each of which has an average thickness of 0.01–0.50 μm and contains aluminum therein, an aluminum content in the each of the intermediate coating layers being larger than that in the each of the first coating layers and smaller than that in the each of the second coating layers.

Where the coating layers contiguous to each other have the respective components which are considerably different from each other, the contiguous coating layers are likely to be chipped at interfaces therebetween, making it impossible to absorb the impact applied to the multilayer coating. In this case, the toughness of the entirety of the multilayer coating is increased by the provision of the intermediate coating layer between the first and second coating layers. The aluminum content in the intermediate layer is larger than that in the first coating layer and smaller than that in the second coating layer. Since the hardness of the intermediate coating layer is larger than that of the first coating layer and is smaller than that of the second coating layer, the intermediate coating layer is not capable of absorbing the impact applied to the multilayer coating where the thickness is less than 0.01 μm. The intermediate coating layer is likely to be chipped where the thickness is more than 0.50 μm.

According to a first preferred form of the fifth aspect of the present invention, wherein the each of the first coating layers has a composition represented by $(Al_X Ti_{1-X})(N_Y C_{1-Y})$ wherein $0.05 \leq X \leq 0.50$, $0.50 \leq Y \leq 1.00$, the each of the second coating layers having a composition represented by $(Al_Z Ti_{1-Z})(N_T C_{1-T})$ wherein $0.50 \leq Z \leq 0.80$, $0.50 \leq T \leq 1.00$, the each of the intermediate layers having a composition represented by $(Al_U Ti_{1-U})(N_V C_{1-V})$ wherein $X<U<Z$, $0.50 \leq V \leq 1.00$.

According to one advantageous arrangement of the first preferred form of the fifth aspect of the invention, the multilayer coating has a stoichiometrically aluminum-rich bulk composition.

The aluminum-rich stoichiometric composition in the entirety of the multilayer coating leads to satisfaction in the following expression (2), wherein X, Z, U represent the mixing ratio of aluminum in the respective first, second and intermediate coating layers; $l_1$ represents the average thickness of the first coating layer; $l_2$ represents the average thickness of the second coating layer; and $l_3$ represents the average thickness of the intermediate coating layer.

$$(Xl_1+Zl_2+2Ul_3)/(l_1+l_2+2l_3)>0.5 \quad (2)$$

According to a second preferred form of the fifth aspect of the invention, the each of the first coating layers has a composition represented by $Ti(N_s C_{1-s})$ wherein $0.50 \leq s \leq 1.00$, the each of the second coating layers having a composition represented by $(Al_t Ti_{1-t})(N_u C_{1-u})$ wherein $0.50<t \leq 0.80$, $0.50 \leq u \leq 1.00$, the each of the intermediate layers having a composition represented by $(Al_v Ti_{1-v})(N_w C_{1-w})$ wherein $0.20 \leq v<0.50$, $0.50 \leq w \leq 1.00$.

If the second coating layer has an aluminum content of 50% or less, the multilayer coating does not exhibit sufficient heat resistance and hardness. If the second coating layer has an aluminum content of more than 80%, on the other hand, the multilayer coating does not exhibit a sufficient hardness. Therefore, the aluminum content of the second coating layer should be more than 50% but should not exceed 80%. Further, if the intermediate coating layer has an aluminum content of less than 20%, the multilayer coating does not exhibit sufficient heat resistance and hardness. If the intermediate coating layer has an aluminum content of 50% or more, on the other hand, the hardness of the multilayer coating is excessively enlarged, whereby the multilayer coating does not sufficiently absorb the impact applied thereto. Therefore, the aluminum content of the intermediate coating layer should be at least 20% but should be less than 50%.

According to one advantageous arrangement of the second preferred form of the fifth aspect of the invention, the thickness of the each of the first coating layers is 0.01–0.40 μm, the average thickness of the each of the second coating layers is 0.01–0.40 μm, and the average thickness of the each of the intermediate coating layers is 0.01–0.20 μm.

In the hard multilayer coated tool constructed according to the present advantageous arrangement, the high degree of wear resistance and the high degree of heat resistance of the multilayer are further assured while the second coating layer is further assuredly prevented from being chipped. It is preferable that the total thickness of the three layers consisting of each second coating layer and the adjacent two intermediate coating layers be 0.50 μm or less, for preventing the multilayer coating or the coating layers from being chipped at interfaces therebetween.

A third preferred form of the fifth aspect of the invention, the hard multilayer coated tool further comprises an interface layer which contains titanium therein and which is interposed between the substrate and the multilayer coating.

In the hard multilayer coated tool constructed according to the third preferred form of the fifth aspect of the present invention, the interface layer, which is formed of TiN, for example, is provided between the substrate and the multilayer coating, for increasing the adhesiveness of the multilayer coating with the substrate.

According to a fourth preferred form of the fifth aspect of the present invention, the hard multilayer coated tool further comprises a surface layer which contains aluminum therein and which is superposed on an outer surface of the multilayer coating.

It is noted that, in the hard multilayer coated tool of the present invention, the wear resistance of the multilayer coating is further increased with an increase in the carbon content in each coating layer of the multilayer coating. However, if the carbon content in each coating layer is increased to such an extent that the carbon content exceeds the nitrogen content, the hardness of the multilayer coating is excessively increased, resulting in a poor achievement in absorbing or damping the impact applied thereto.

BEST MODE FOR CARRYING OUT THE INVENTION

Figure 1:
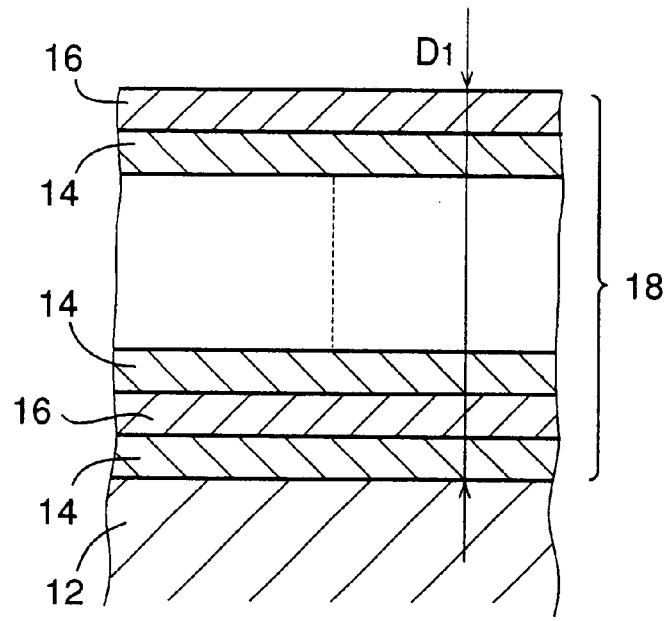
FIG. 1 is a cross sectional view of a hard multilayer coated tool constructed according to a first embodiment of the present invention.

FIG. 1 is a cross sectional view showing a hard multilayer coated tool constructed according to a first embodiment of the present invention. On a surface of a substrate 12 of the tool, there is provided a hard multilayer coating 18 which consists of a plurality of inner layers 14 and the same number of outer layers 16 as that of the inner layers 14. The inner and outer layers 14, 16 are alternately laminated or superposed on the substrate 12, so as to be contiguous to each other. The inner layers 14 correspond to the first coating layers, and one of the inner layers 14 constitutes an innermost layer of the hard multilayer coating 18 which is adjacent to the substrate 12. Each of the inner layers 14 has an average thickness of 0.01–0.50 $\mu$m and a composition represented by $(Al_X Ti_{1-X})(N_Y C_{1-Y})$ wherein $0.05 \leq X \leq 0.50$, $0.50 \leq Y \leq 1.00$. The outer layers 16 correspond to the second coating layers, and one of the outer layers 16 constitutes an outermost layer of the hard multilayer coating 18 which is remote from the substrate 12. Each of the outer layers 16 has an average thickness of 0.01–0.50 $\mu$m and a composition represented by $(Al_Z Ti_{1-Z})(N_T C_{1-T})$ wherein $0.50 < Z \leq 0.80$, $0.50 \leq T \leq 1.00$. The hard multilayer coating 18 has a stoichiometrically aluminum-rich bulk composition, wherein the thickness of the inner layer 14, the thickness of the outer layer 16 and the mixing ratios X, Z of aluminum in the respective inner and outer layers 14, 16 are determined such that the above-described expression (1) is satisfied, and such that the hard multilayer coating 18 has an average thickness $D_1$ of 0.50–10.0 $\mu$m. This first embodiment will be further clarified as Examples 1–5.

Figure 2:
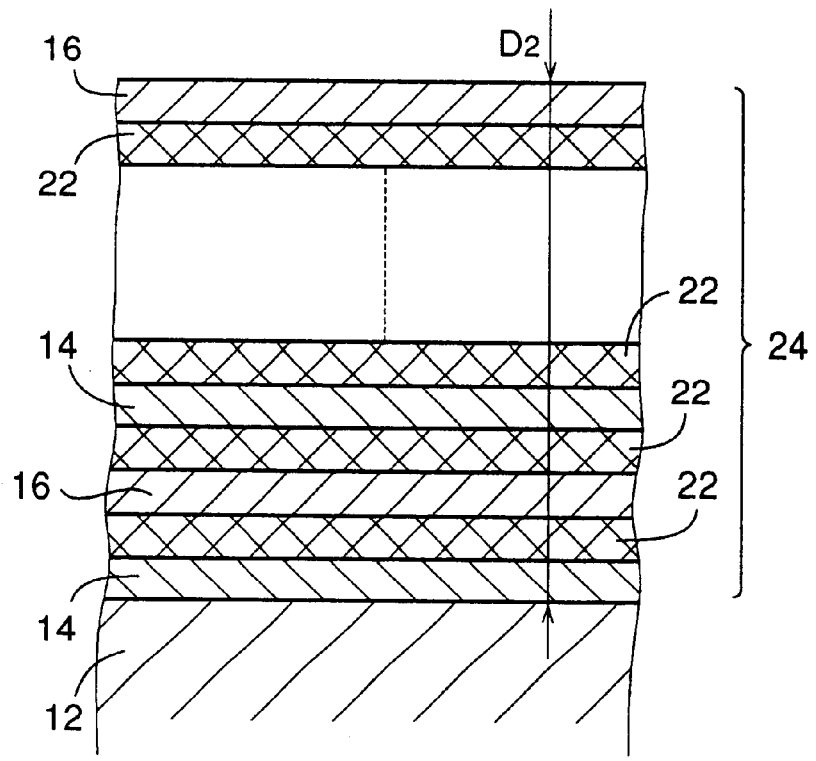
FIG. 2 is a cross sectional view of a hard multilayer coated tool constructed according to a second embodiment of the present invention.

FIG. 2 is a cross sectional view showing a hard multilayer coated tool constructed according to a second embodiment of the present invention. This tool is different from the hard multilayer coated tool of FIG. 1 in that the hard multilayer coating 18 is replaced by a hard multilayer coating 24 additionally including a plurality of intermediate layers 22 which correspond to the intermediate coating layers. Each of the intermediate layers 22 is interposed between the adjacent inner and outer layers 14, 16, and has an average thickness of 0.01–0.50 $\mu$m and a composition represented by $(Al_U Ti_{1-U})(N_V C_{1-V})$ wherein $X < U < Z$, $0.50 \leq V \leq 1.00$. The hard multilayer coating 24, which is constituted by the inner, outer and intermediate layers 14, 16, 22, has a stoichiometrically aluminum-rich bulk composition, wherein the thickness of each of the inner, outer and intermediate layers 14, 16, 22 and the mixing ratios X, Z, U of aluminum in the respective inner, outer and intermediate layers 14, 16, 22 are determined such that the above-described expression (2) is satisfied, and such that the hard multilayer coating 24 has an average thickness $D_2$ of 0.50–10.0 $\mu$m. This second embodiment will be further clarified as Examples 6 and 7.

For increasing the adhesiveness of the hard multilayer coating 18 or 24 to the substrate 12 of the tool, an interface layer formed of TiN, for example, may be provided between the substrate 12 and the hard multilayer coating 18 or 24, as needed. Further, a surface layer formed of an aluminum-rich AlTiN, for example, may be additionally provided on the outer surface of the hard multilayer coating 18 or 24, as needed.

The specified examples of the first and second embodiments will be explained.

EXAMPLE 1

A cemented-carbide endmill (whose primary component was WC-10Co corresponding to JIS Z10) having a diameter of 10.0 mm, a cutting edge length (flute length) of 25.0 mm, a total length of 80.0 mm and six cutting edges or teeth was set in a substrate holder of an arc-type ion plating device having a cathode electrode as a target formed of an $Al_{0.4} Ti_{0.6}$ alloy and a target formed of an $Al_{0.7} Ti_{0.3}$ alloy. The endmill was rotated together with the substrate holder while being heated by a heater installed in the plating device. The device was then evacuated until the pressure within the device was reduced to $6.70 \times 10^{-3}$ Pa, and the endmill was heated up to 400° C. by the heater. An electric potential of $-1000V$ was applied to the endmill so as to cause arc discharge for cleaning the surface of the endmill. After the surface of the endmill had been sufficiently cleaned, the applied electric potential was reduced down to $-200V$ while $N_2$ gas was supplied into the device at a rate of 1000 cc/min, so that a hard multilayer coating whose total thickness was 3.00 $\mu$m was formed on the endmill. The multilayer coating had inner layers (first coating layers) of $Al_{0.4} Ti_{0.6}$ alloy having an average thickness of 0.10 $\mu$m, and outer layers (second coating layers) of $Al_{0.7} Ti_{0.3}$ alloy having an average thickness of 0.10 $\mu$m. The inner and outer layers were alternately laminated or superposed on each other at a pitch of 0.20 $\mu$m. Namely, the pitch or spacing interval between the adjacent two outer layers or between the adjacent two inner layers was 0.20 $\mu$m (=the thickness of 0.10 $\mu$m of each inner layer+the thickness of 0.10 $\mu$m of each outer layer). Each of the thickness values was measured by observing, through a scanning type electron microscope, a transverse cross section of the endmill which had been obtained by cutting the endmill. A qualitative analysis or determination of the composition of each coating layer by means of an Auger electron spectroscopy revealed that the composition of the inner layer and that of the outer layer were $Al_{0.37}Ti_{0.63}N$ and $Al_{0.69}Ti_{0.37}N$, respectively, which were substantially identical with those of the cathode (targets). Thus, the mixing ratio of the aluminum in the entirety of the multilayer coating resulted in $0.53[=(0.37+0.69) \div 2]$.

EXAMPLE 2

A hard multilayer coating was formed under a condition which was identical with the above-described condition of the example 1 except that $Al_{0.4}Ti_{0.6}$ alloy was used as a target in the formation of the inner layers and that $Al_{0.8}Ti_{0.2}$ alloy was used as a target in the formation of the outer layers. The composition of the inner layer and that of the outer layer were $Al_{0.39}Ti_{0.61}N$ and $Al_{0.78}Ti_{0.22}N$, respectively. Thus, the mixing ratio of the aluminum in the entirety of the multilayer coating resulted in $0.59[\approx(0.39+0.78) \div 2]$.

EXAMPLE 3

A hard multilayer coating was formed under a condition which was identical with the above-described condition of the example 1, except that $Al_{0.3}Ti_{0.7}$ alloy and $Al_{0.7}Ti_{0.3}$ alloy were used as targets in the formations of the inner and outer layers, respectively, and that the average thickness of the inner and outer layers were 0.10 μm and 0.20 μm, respectively, so that the pitch or spacing interval between each adjacent two of the outer layers or between each adjacent two of the inner layers was 0.30 μm (=the thickness of 0.10 μm of each inner layer+the thickness of 0.20 μm of each outer layer). The composition of the inner layer and that of the outer layer were $Al_{0.29}Ti_{0.71}N$ and $Al_{0.68}Ti_{32}N$, respectively. Thus, the mixing ratio of the aluminum in the entirety of the multilayer coating resulted in $0.55\ [=(0.29+0.68\times2) \div 3]$.

EXAMPLE 4

A hard multilayer coating was formed under a condition which was identical with the above-described condition of the example 1, except that $Al_{0.3}Ti_{0.7}$ alloy and $Al_{0.8}Ti_{0.2}$ alloy were used as targets in the formations of the inner and outer layers, respectively, and that an interface layer of TiN having a thickness of 0.10 μm is formed by using Ti as a target. The interface layer is interposed between the surface of the substrate and the multilayer coating for further increasing the adhesiveness of the multilayer coating to the base material of the endmill. Further, differently from in the example 1, the average thickness of the inner and outer layers were 0.10 μm and 0.20 μm, respectively, so that the spacing interval between each adjacent two of the outer layers or between each adjacent two of the inner layers was 0.30 μm (the thickness of 0.10 μm of each inner layer+the thickness of 0.20 μm of each outer layer). The thickness of the multilayer coating was 3.00 μm, and the entire thickness including that of the interface layer was 3.10 μm. The mixing ratio of the aluminum in the entirety of the multilayer coating was $0.63[\approx(0.30+0.80\times2) \div 3]$.

EXAMPLE 5

A hard multilayer coating was formed under a condition which was identical with the above-described condition of the example 1, except that $Al_{0.3}Ti_{0.7}$ alloy and $Al_{0.7}Ti_{0.3}$ alloy were used as the targets in the formations of the inner and outer layers, respectively, and that an interface layer of TiN having a thickness of 0.10 μm was formed by using Ti as a target. The interface layer was interposed between the surface of the substrate and the multilayer coating for further increasing the adhesiveness of the multilayer coating to the base material of the endmill. Further, differently from example 1, the average thickness of the inner and outer layers were 0.10 μm and 0.20 μm, respectively, so that the spacing interval between each adjacent two of the outer layers Or between each adjacent two of the inner layers was 0.30 μm (=the thickness of 0.10 μm of each inner layer+the thickness of 0.20 μm of each outer layer). Still further, a surface layer of $Al_{0.7}Ti_{0.3}N$ having a thickness of 0.50 μm was additionally formed on the outer surface of the multilayer coating, for thereby further increasing the aluminum content in the entirety of the multilayer coating. The thickness of the multilayer coating was 3.00 μm, and the entire thickness including those of the interface layer and the surface layer was 3.60 μm. The composition of the surface layer was $Al_{66}Ti_{0.34}N$. The mixing ratio of the aluminum in the entirety of the multilayer coating (excluding the surface layer) resulted in the same as in the example 3.

EXAMPLE 6

A hard multilayer coating was formed under a condition which was identical with the above-described condition of the example 1, except that $Al_{0.2}Ti_{0.8}$ alloy, $Al_{0.5}Ti_{0.5}$ alloy and $Al_{0.8}Ti_{0.2}$ alloy were used as targets in the formations of the inner, intermediate and outer layers, respectively, and that the average thickness of the inner, intermediate and outer layers are 0.10 μm, 0.10 μm and 0.20 μm, respectively. The spacing interval between each adjacent two of the outer layers, or between each adjacent two of the inner layers, was 0.50 μm (=the thickness of 0.10 μm of each inner layer+the thickness of 0.10 μm of each intermediate layer+the thickness of 0.20 μm of each outer layer+the thickness of 0.10 μm of each intermediate layer). The multilayer coating was constituted by seven sets of the inner and outer layers, and thirteen of the intermediate layers, so that the thickness of the multilayer coating was 3.40 μm $[=(0.10+0.20)\times7+0.10\times(14-1)]$. It is to be understood that the outermost layer of the multilayer coating was not constituted by the intermediate layer but constituted by the outer layer. The compositions of the inner, intermediate and outer layers were $Al_{0.21}Ti_{0.79}N$, $Al_{0.48}Ti_{0.52}N$ and $Al_{0.78}Ti_{0.22}N$, respectively. The aluminum content in the inner layer was adapted to be relatively low for thereby increasing the adhesiveness of the multilayer coating with the base material of the endmill, while the aluminum content in the outer layer was adapted to be relatively high for thereby increasing the aluminum content in the entirety of the multilayer coating. Since the considerably large difference between the aluminum content in the inner layer and that in the outer layer would decrease the toughness of the multilayer coating, the intermediate layer was employed for alleviating or decreasing the difference in the mechanical property due to the difference in the aluminum content. The mixing ratio of the aluminum in the entirety of the multilayer coating, which consisted of the inner, intermediate and outer layers, resulted in 0.546 $[=(0.21+0.78\times2+0.48\times2) \div 5]$.

EXAMPLE 7

A hard multilayer coating was formed under a condition which was identical with the above-described condition of the example 1, except that $Al_{0.2}Ti_{0.8}$ alloy, $Al_{0.5}Ti_{0.5}$ alloy and $Al_{0.8}Ti_{0.2}$ alloy were used as targets in the formations of the inner, intermediate and outer layers, respectively, and that an interface layer of TiN having a thickness of 0.10 μm was formed by using Ti as a target. The interface layer was interposed between the surface of the substrate and the multilayer coating for further increasing the adhesiveness of the multilayer coating with the base material of the endmill. Further, differently from in the example 1, the average thickness of the inner, intermediate and outer layers were 0.10 μm, 0.10 μm and 0.20 μm, respectively, so that the spacing interval between each adjacent two of the outer layers, or between each adjacent two of the inner layers, was 0.50 μm (=the thickness of 0.10 μm of each inner layer+the thickness of 0.10 μm of each intermediate layer+the thickness of 0.20 μm of each outer layer+the thickness of 0.10 μm of each intermediate layer). Still further, a surface layer of $Al_{0.8}Ti_{0.2}N$ having a thickness of 0.50 μm is additionally formed on the outer surface of the multilayer coating. The thickness of the multilayer coating was 3.00 μm [=(0.10+0.20)×6+0.10×12], and the entire thickness including those of the interface layer and the surface layer was 3.60 μm. The composition of the surface layer was $Al_{0.78}Ti_{0.22}N$.

The following comparative examples 1–3, each not having an equivalent to the hard multilayer coating according to the present invention, were then prepared as the conventional coatings, for comparing the coatings of the examples 1–7 with the conventional coatings.

Comparative Example 1

An interface layer and a surface layer were formed under a condition which was identical with the above-described condition of the example 1 except that an $Al_{0.5}Ti_{0.5}$ alloy and Ti were used as targets. The interface layer of TiN having a thickness of 0.10 μm was formed on the surface of the substrate, using the Ti target, and the surface layer of $Al_{0.5}Ti_{0.5}N$ having a thickness of 3.50 μm was formed on the surface of the interface layer, using the $Al_{0.5}Ti_{0.5}$ alloy target. The composition of the surface layer was $Al_{0.49}Ti_{0.51}$.

Comparative Example 2

An interface layer and a surface layer were formed under a condition which was identical with the above-described condition of the example 1 except that $Al_{0.7}Ti_{0.3}$ alloy and Ti were used as targets, such that the interface layer of TiN having a thickness of 0.10 μm is provided on the surface of the substrate, and such that the surface layer of $Al_{0.7}Ti_{0.3}N$ having a thickness of 3.70 μm is provided on the surface of the interface layer. The composition in the surface layer was $Al_{0.68}Ti_{0.32}$.

Comparative Example 3

An interface layer and a surface layer were formed under a condition which was identical with the above-described condition of the example 1 except that $Al_{0.8}Ti_{0.2}$ alloy and Ti were used as targets, such that the interface layer constituted of TiN having a thickness of 0.10 μm is provided on the surface of the substrate, and such that the surface layer of $Al_{0.8}Ti_{2}N$ having a thickness of 3.70 μm is provided on the surface of the interface layer. The composition in the surface layer was $Al_{0.67}Ti_{0.33}$.

Each sample (endmill) of the examples 1–7 and the comparative examples 1–3 was tested for cutting or milling a side face of a workpiece, under the following cutting condition. In the test, the accumulative distance over which the side face had been cut by the endmill was measured when the flank faces of the peripheral cutting edges of the endmill were worn over a width of 0.10 mm. The result is shown in Table 1.

(Cutting condition)
Workpiece: SKD11 (hardness: 60 HRC)
Cutting velocity: 150 m/min
Feed rate: 0.10 mm/tooth (mm/edge)
Depth of cut:
   AD (Axial depth)=10.0 mm,
   RD (Radial depth)=0.50 mm
Cutting fluid: Dry cutting without cutting fluid

TABLE 1

| | | Composition of coating thickness (μm) | | | Hard multilayer coating | | | | | | Thickness | | |
| --- | --- | --- | --- | --- | --- | --- | --- | --- | --- | --- | --- | --- | --- |
| | | | | | Inner layer $Al_xTi_{1-x}N$ | | Intermediate layer $Al_uTi_{1-u}N$ | | Outer layer $Al_zTi_{1-z}N$ | | Spacing interval (μm) | of hard multilayer coating (μm) | |
| No. | | Interface layer | Hard multilayer coating | Surface layer | Composition | Average thickness (μm) | Composition | Average thickness (μm) | Composition | Average thickness (μm) | | | Entire thickness (μm) | Cutting length (m) |
| Example | 1 | NO | YES | NO | X = 0.4 | 0.10 | NO | 0 | Z = 0.7 | 0.10 | 0.20 | 3.00 | 3.00 | 120 |
| | 2 | NO | YES | NO | X = 0.4 | 0.10 | NO | 0 | Z = 0.8 | 0.10 | 0.20 | 3.00 | 3.00 | 145 |
| | 3 | NO | YES | NO | X = 0.3 | 0.10 | NO | 0 | Z = 0.7 | 0.20 | 0.30 | 3.00 | 3.00 | 168 |
| | 4 | TiN (0.10) | YES | NO | X = 0.3 | 0.10 | NO | 0 | Z = 0.8 | 0.20 | 0.30 | 3.00 | 3.10 | 192 |
| | 5 | TiN (0.10) | YES | $Al_{0.7}Ti_{0.3}N$ (0.50) | X = 0.3 | 0.10 | NO | 0 | Z = 0.7 | 0.20 | 0.30 | 3.00 | 3.60 | 203 |
| | 6 | NO | YES | NO | X = 0.2 | 0.10 | U = 0.5 | 0.10 | Z = 0.8 | 0.20 | 0.50 | 3.40 | 3.40 | 231 |
| | 7 | TiN (0.10) | YES | $Al_{0.8}Ti_{0.2}N$ (0.50) | X = 0.2 | 0.10 | U = 0.5 | 0.10 | Z = 0.8 | 0.20 | 0.50 | 3.00 | 3.60 | 248 |
| Comparative Example | 1 | TiN (0.10) | NO | $Al_{0.5}Ti_{0.5}N$ (3.50) | | | | | | | | | 3.60 | 56 |
| | 2 | TiN (0.10) | NO | $Al_{0.7}Ti_{0.3}N$ (3.70) | | | | | | | | | 3.80 | 68 |
| | 3 | TiN (0.10) | NO | $Al_{0.8}Ti_{0.2}N$ (3.70) | | | | | | | | | 3.80 | 67 |

As is clear from Table 1, the endmills of the examples 1–7 of the present invention exhibited a higher degree of wear resistance than the conventional endmills of the comparative examples 1–3. In the hard multilayer coated tool of the present invention, even where the aluminum content in the outer layer (second coating layer) is increased in the interest of increasing the degree of hardness or heat resistance of the coating, the coating is less likely to be chipped than in the conventional tool. That is, the durability of the multilayer coated tool of the present invention can be increased by increasing the aluminum content in the outer layer or the thickness of the outer layer. Further, the tools of the examples 6, 7 each of which has the intermediate layers (intermediate coating layers) exhibits a still further excellent wear resistance than the tools of the embodiments 1–5 each of which does not have the intermediate layers.

Figure 3:
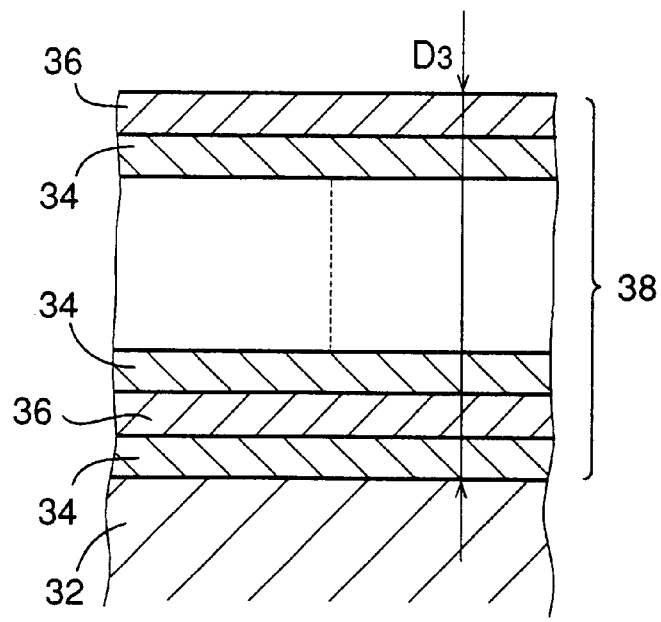
FIG. 3 is a cross sectional view of a hard multilayer coated tool constructed according to a third embodiment of the present invention.

FIG. 3 is a cross sectional view showing a hard multilayer coated tool constructed according to a third embodiment of the present invention. On a surface of a substrate 32 of the tool, there is provided a hard multilayer coating 38 which consists of a plurality of inner layers 34 and the same number of outer layers 36 as that of the inner layers 34. The inner and outer layers 34, 36 are alternately laminated on the substrate 32, so as to be contiguous to each other. The inner layers 34 correspond to the first coating layers, and one of the inner layers 34 constitutes an innermost layer of the hard multilayer coating 38. Each of the inner layers 34 has an average thickness of 0.01–0.40 $\mu$m and a composition represented by Ti $(N_x C_{1-x})$ (wherein $0.50 \leq x \leq 1.00$). The outer layers 36 correspond to the second coating layers, and one of the outer layers 36 constitutes an outermost layer of the hard multilayer coating 38. Each of the outer layers 36 has an average thickness of 0.01–0.40 $\mu$m and a composition represented by $(Al_y Ti_{1-y})(N_z C_{1-z})$ (wherein $0.20 \leq y \leq 0.80$, $0.50 \leq z \leq 1.00$). The hard multilayer coating 38 has an average thickness $D_3$ of 0.50–10.0 $\mu$m. This third embodiment will be further specified as the below-described examples 8–11.

Figure 4:
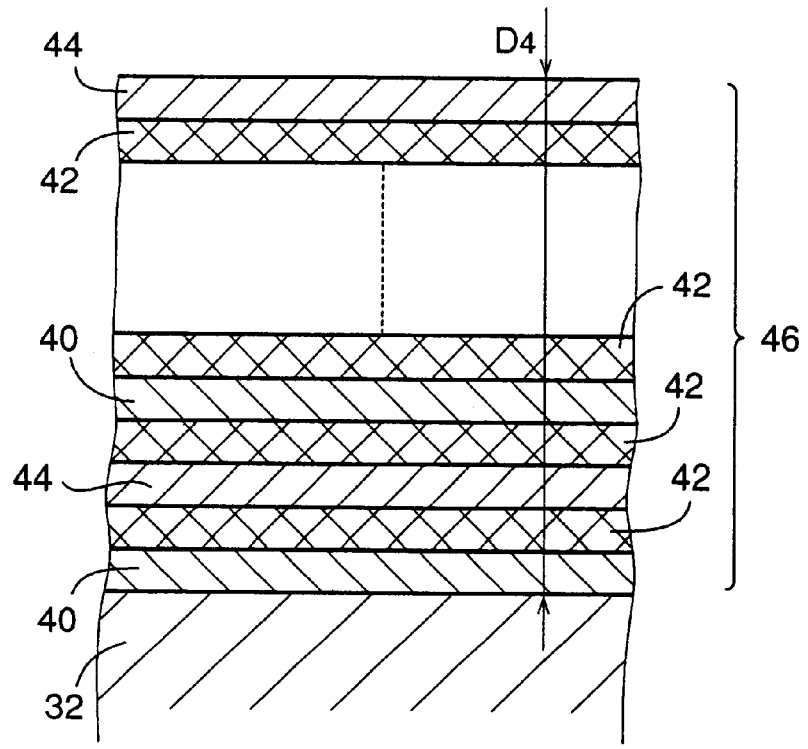
FIG. 4 is a cross sectional view of a hard multilayer coated tool constructed according to a fourth embodiment of the present invention.

FIG. 4 is a cross sectional view showing a hard multilayer coated tool constructed according to a fourth embodiment of the present invention. On a surface of the substrate 32 of the tool, there is provided a hard multilayer coating 46 which consists of a plurality of inner and outer layers 40, 44 and a plurality of intermediate layers 42 each of which is interposed between the inner and outer layers 40, 44. The inner layers 40 correspond to the first coating layers, and one of the inner layers 40 constitutes an innermost layer of the hard multilayer coating 46. Each of the inner layers 40 has an average thickness of 0.01–0.40 $\mu$m and a composition represented by Ti $(N_s C_{1-s})$ (wherein $0.50 \leq s \leq 1.00$). The outer layers 44 correspond to the second coating layers, and one of the outer layers 44 constitutes an outermost layer of the hard multilayer coating 46. Each of the outer layers 44 has an average thickness of 0.01–0.40 $\mu$m and a composition represented by $(Al_t Ti_{1-t})(N_u C_{1-u})$ (wherein $0.50 < t \leq 0.80$, $0.50 \leq u \leq 1.00$). The intermediate layers 42 correspond to the intermediate coating layers. Each of the intermediate layers 42 has an average thickness of 0.01–0.20 $\mu$m and a composition represented by $(Al_v Ti_{1-v})(N_w C_{1-w})$ (wherein $0.20 \leq v < 0.50$, $0.50 \leq w \leq 1.00$). The hard multilayer coating 46 has an average thickness $D_4$ of 0.50–10.0 $\mu$m. This fourth embodiment will be further specified as the below-described examples 12–14.

For increasing the adhesiveness of the hard multilayer coating 38 or 46 to the substrate 32 of the tool, an interface layer formed of TiN, for example, may be provided between the substrate 32 and the hard multilayer coating 38 or 46, as needed. Further, a surface layer formed of an aluminum-rich AlTiN may be additionally provided on an outer surface of the hard multilayer coating 38 or 46, as needed.

The specified examples of the third and fourth embodiments will be explained.

EXAMPLE 8

A cemented-carbide made endmill (whose primary component was WC-10Co corresponding to JIS Z10) having a diameter of 10.0 mm, a cutting edge length (flute length) of 25.0 mm, a total length of 80.0 mm and six cutting teeth was set in a substrate holder of an arc-type ion plating device having a cathode electrode as a target formed of $Al_{0.7} Ti_{0.3}$ alloy and a target formed of Ti. The endmill was rotated together with the substrate holder while being heated by a heater installed in the plating device. The device was then evacuated until the pressure within the device was reduced to $6.70 \times 10^{-3}$ Pa, and the endmill was heated up to 500° C. by the heater. An electric potential of −1000V was applied to the endmill so as to cause arc discharge for cleaning the surface of the endmill. After the surface of the endmill had been sufficiently cleaned, the applied electric potential was reduced down to −200V while $N_2$ gas was supplied into the device at a rate of 1000 cc/min, so that a hard multilayer coating whose total thickness was 3.20 $\mu$m was formed on the endmill. The multilayer coating had inner layers (first coating layers) of Ti having an average thickness of 0.10 $\mu$m, and outer layers (second coating layers) of $Al_{0.7}Ti_{0.3}$ alloy having an average thickness of 0.10 $\mu$m. The pitch or spacing interval between the adjacent two outer layers or between the adjacent two inner layers was 0.20 $\mu$m (=the thickness of 0.10 $\mu$m of each inner layer+the thickness of 0.10 $\mu$m of each outer layer). Each of the thickness values was measured by observing, through a scanning type electron microscope, a transverse cross section of the endmill which had been obtained by cutting the endmill. A qualitative analysis or determination of the composition of the outer layer by means of an Auger electron spectroscopy revealed that the composition of the outer layer was $Al_{0.69}Ti_{0.31}N$, which was substantially equal to the cathode component.

EXAMPLE 9

A hard multilayer coating was formed under a condition which was identical with the above-described condition of the example 8 except that the average thickness of the outer layers was increased to 0.20 $\mu$m, so that the spacing interval between each adjacent two of the outer layers or between each adjacent two of the inner layers was 0.30 $\mu$m (=the thickness of each inner layer; 0.10 $\mu$m+the thickness of each outer layer; 0.20 $\mu$m), and so that the hard multilayer coating had a thickness of 3.00 $\mu$m. The composition of the outer layer was $Al_{0.68}Ti_{0.32}N$.

EXAMPLE 10

A hard multilayer coating was formed under a condition which was identical with the above-described condition of the example 8, except that an interface layer of TiN having a thickness of 0.10 $\mu$m was formed by using Ti as a target, and that the average thickness of the outer layers of the hard multilayer coating was further increased to 0.30 $\mu$m. The interface layer was interposed between the surface of the substrate and the hard multilayer coating for increasing the adhesiveness of the hard multilayer coating to the base material of the endmill. The increase in the average thickness of the outer layers served to further increase the aluminum content in the entirety of the hard multilayer coating. Thus, the spacing interval between each adjacent two of the outer layers or between each adjacent two of the inner layers was 0.40 μm (=the thickness of 0.10 μm of each inner layer+the thickness of 0.30 μm of each outer layer). The thickness of the hard multilayer coating was 2.80 μm, and the entire thickness including that of the interface layer was 2.90 μm. The composition of the outer layer was $Al_{0.68}Ti_{0.32}N$.

EXAMPLE 11

A hard multilayer coating was formed under a condition which was identical with the above-described condition of the example 10 except that the average thickness of the outer layers was 0.20 μm, and that a surface layer formed of $Al_{0.7}Ti_{0.3}$ N having a thickness of 0.50 μm is additionally provided on the outer surface of the multilayer coating, by using $Al_{0.7}Ti_{0.3}$ as a target. The provision of the surface layer served to further increase the aluminum content in the entirety of the hard multilayer coating. The spacing interval between each adjacent two of the outer layers or between each adjacent two of the inner layers was 0.30 μm (=the thickness of 0.10 μm of each inner layer+the thickness of 0.20 μm of each outer layer). The thickness of the hard multilayer coating was 2.70 μm, and the entire thickness including that of the surface layer was 3.30 μm. The composition of the surface layer was substantially equal to the target.

EXAMPLE 12

A multilayer coating was formed under a condition which was identical with the above-described condition of the example 8, except that Ti, $Al_{0.3}Ti_{0.7}$ alloy and $Al_{0.8}Ti_{0.2}$ alloy were used as targets in the formations of the inner, intermediate and outer layers, respectively, and that the average thickness of the inner, intermediate and outer layers were 0.10 μm, 0.10 μm and 0.20 μm, respectively. The spacing interval between each adjacent two of the outer layers, or between each adjacent two of the inner layers, is 0.50 μm (=the thickness of 0.10 μm of each inner layer+the thickness of 0.10 μm of each intermediate layer+the thickness of 0.20 μm of each outer layer+the thickness of 0.10 μm of each intermediate layer). The multilayer coating was constituted by six sets of the inner and outer layers, and eleven of the intermediate layers, so that the thickness of the multilayer coating was 2.90 μm [=(0.10+0.20)×6+0.10×(12−1)]. It is to be understood that the outermost layer of the multilayer coating is not constituted by the intermediate layer but constituted by the outer layer. Since the considerably large difference between the hardness of the inner layer and that of the outer layer would decrease the toughness of the multilayer coating, the intermediate layer was employed for decreasing or alleviating the difference in the mechanical property due to the difference in the hardness. The composition of the intermediate layer and that of the outer layer were substantially equal to the respective targets.

EXAMPLE 13

A hard multilayer coating was formed under a condition which was identical with the above-described condition of the example 12, except that an interface layer of TiN having a thickness of 0.10 μm was additionally formed by using Ti as a target, and that $Al_{0.4}Ti_{0.6}$ alloy was used as a target in the formation of the intermediate layer. The interface layer was interposed between the surface of the substrate and the hard multilayer coating for increasing the adhesiveness of the hard multilayer coating to the base material of the endmill. The entire thickness including that of the interface layer was 3.00 μm. The composition of the intermediate layer was $Al_{0.41}Ti_{0.59}N$, while that of the outer layer was $Al_{0.81}Ti_{0.19}N$.

EXAMPLE 14

A hard multilayer coating was formed under a condition which is identical with the above-described condition of the example 13, except that $Al_{0.5}Ti_{0.5}$ alloy was used as a target in the formation of the intermediate layers of the hard multilayer coating, and that the average thickness of the inner and outer layers were 0.20 μm and 0.30 μm, respectively. Further, differently from the example 13, a surface layer of $Al_{0.8}Ti_{0.2}N$ having a thickness of 0.50 μm was additionally formed on the outer surface of the hard multilayer coating, by using $Al_{0.8}Ti_{0.2}$ alloy as a target, for thereby increasing the aluminum content in the entirety of the hard multilayer coating. The spacing interval between each adjacent two of the outer layers, or between each adjacent two of the inner layers, was 0.70 μm (=the thickness of 0.20 μm of each inner layer+the thickness of 0.10 μm of each intermediate layer+the thickness of 0.30 μm of each outer layer+the thickness of 0.10 μm of each intermediate layer). The multilayer coating was constituted by four sets of the inner and outer layers, and eight of the intermediate layers, so that the thickness of the multilayer coating was 2.80 μm [=(0.20+0.30)×4+0.10×8]. The entire thickness including thickness of the interface and surface layer was 3.40 μm. The composition of the surface layer was $Al_{0.78}Ti_{0.22}N$.

The following comparative examples 4–6, each not having an equivalent to the hard multilayer coating, were then prepared as the conventional coatings, for comparing the hard multilayer coatings of the examples 8–14 with the conventional coatings.

Comparative Example 4

A surface layer was formed under a condition which was identical with the above-described condition of the example 8 except that $Al_{0.5}Ti_{0.5}$ alloy was used as a target, such that the surface layer formed of $Al_{0.5}Ti_{0.5}N$ and having a thickness of 3.20 μm is provided on the surface of the substrate. The composition in the surface layer was $Al_{0.49}Ti_{0.51}N$.

Comparative Example 5

An interface layer and a surface layer were formed under a condition which was identical with the above-described condition of the example 8 except that $Al_{0.7}Ti_{0.3}$ alloy and Ti were used as targets, such that the interface layer formed of TiN and having a thickness of 0.10 μm was provided on the surface of the substrate, and such that the surface layer formed of $Al_{0.7}Ti_{0.3}N$ and having a thickness of 3.20 μm was provided on the interface layer. The composition in the surface layer was $Al_{0.68}Ti_{0.32}N$.

Comparative Example 6

An interface layer and a surface layer were formed under a condition which was identical with the above-described condition of the example 8 except that $Al_{0.8}Ti_{0.2}$ alloy and Ti were used as targets, such that the interface layer formed of TiN and having a thickness of 0.10 μm was provided on the surface of the substrate, and such that the surface layer formed of $Al_{0.8}Ti_{0.2}N$ and having a thickness of 3.00 μm was provided on the interface layer. The composition in the surface layer was $Al_{0.68}Ti_{0.32}$.

Each sample (endmill) of the examples 8–14 and the comparative examples 4–6 was tested for cutting or milling a side face of a workpiece, under the following cutting condition. In the test, the accumulative distance over which the side face had been cut by the endmill was measured when the flank faces of the peripheral cutting edges of the endmill were worn over a width of 0.10 mm. The result is shown in Table 2.
(Cutting condition)
Workpiece: SKD11 (hardness: 60 HRC)
Cutting velocity: 150 m/min
Feed rate: 0.10 mm/tooth (mm/edge)
Depth of cut:
  AD (Axial depth)=10.0 mm,
  RD (Radial depth)=0.3 mm
Cutting fluid: Dry cutting without cutting fluid layers (intermediate coating layers) exhibits a still further excellent wear resistance than the tools of the examples 8–11 each of which does not have the intermediate layers.

As described above, in the hard multilayer coated tool of the present invention, even where the aluminum content in the second coating layer is increased in the interest of increasing the degree of hardness or heat resistance of the coating, the coating is little likely to be chipped, so that the tool exhibits an excellent wear resistance and accordingly considerably prolonged life. Further, the provision of the intermediate coating layers between the first and second coating layers as in the above-described second and fourth embodiments of the invention is effective to further increase the degree of wear resistance.

While the cemented-carbide made endmills to which the present invention is applied have been specifically explained, the present invention may be applied to a cutting tool made of the other kind of material.

While the hard multilayer coating in each of the above-described specified examples includes the nitride solid solution, the hard multilayer coating may include the carbon nitride solid solution.

It is to be understood that the present invention may be embodied with various other changes, modifications and

TABLE 2

| | | Composition of coating thickness (μm) | | | Hard multilayer coating | | | | | | | | |
| | | | | | Inner layer Ti ($N_xC_{1-x}$) | | Intermediate layer | | Outer layer $Al_yTi_{1-y}N$ | | Spacing (μm) | Thickness of hard multilayer coating (μm) | Entire thickness (μm) | Cutting length (m) |
| | | | | | Ti ($N_sC_{1-s}$) | | $Al_vTi_{1-v}N$ | | $Al_tTi_{1-t}N$ | | | | | |
| No. | | Interface layer | Hard multilayer coating | Surface layer | Composition | Average thickness (μm) | Composition | Average thickness (μm) | Composition | Average thickness (μm) | | | | |
| Example | 8 | NO | YES | NO | x = 1.0 | 0.10 | NO | 0 | y = 0.7 | 0.10 | 0.20 | 3.20 | 3.20 | 123 |
| | 9 | NO | YES | NO | x = 1.0 | 0.10 | NO | 0 | y = 0.7 | 0.20 | 0.30 | 3.00 | 3.00 | 140 |
| | 10 | TiN (0.10) | YES | NO | x = 1.0 | 0.10 | NO | 0 | y = 0.7 | 0.30 | 0.40 | 2.80 | 2.90 | 167 |
| | 11 | TiN (0.10) | YES | $Al_{0.7}Ti_{0.3}N$ (0.50) | x = 1.0 | 0.10 | NO | 0 | y = 0.7 | 0.20 | 0.30 | 2.70 | 3.30 | 191 |
| | 12 | NO | YES | NO | s = 1.0 | 0.10 | v = 0.3 | 0.10 | t = 0.8 | 0.20 | 0.50 | 2.90 | 2.90 | 207 |
| | 13 | TiN (0.10) | YES | NO | s = 1.0 | 0.10 | v = 0.4 | 0.10 | t = 0.8 | 0.20 | 0.50 | 2.90 | 3.00 | 239 |
| | 14 | TiN (0.10) | YES | $Al_{0.8}Ti_{0.2}N$ (0.50) | s = 1.0 | 0.20 | v = 0.5 | 0.10 | t = 0.8 | 0.30 | 0.70 | 2.80 | 3.40 | 285 |
| Comparative Example | 4 | NO | NO | $Al_{0.5}Ti_{0.5}N$ (3.20) | | | | | | | | | 3.20 | 77 |
| | 5 | TiN (0.10) | NO | $Al_{0.7}Ti_{0.3}N$ (3.20) | | | | | | | | | 3.30 | 83 |
| | 6 | TiN (0.10) | NO | $Al_{0.8}Ti_{0.2}N$ (3.00) | | | | | | | | | 3.10 | 69 |

As is clear from Table 2, the endmills of the examples 8–14 of the present invention was applied, exhibited a higher degree of wear resistance than the conventional endmills of the comparative examples 4–6. In the hard multilayer coated tool of the present invention, even where the aluminum content in the outer layer (second coating layer) is increased in the interest of increasing the degree of hardness or heat resistance of the coating, the coating is less likely to be chipped than in the conventional tool. That is, the durability of the multilayer coated tool of the present invention can be increased by increasing the aluminum content in the outer layer or the thickness of the outer layer. Further, the tools of the examples 12–14 each of which has the intermediate improvements, which may occur to those skilled in the art, without departing from the spirit and scope of the present invention.

What is claimed is:
1. A hard multilayer coated tool comprising:
    a substrate; and
    a multilayer coating covering said substrate, said multilayer coating comprising first and second coating layers which are alternately laminated on said substrate, each of said first coating layers having an average thickness of 0.10–0.50 μm and containing titanium therein, each of said second coating layers having an average thickness of 0.10–0.50 μm and containing aluminum therein, said multilayer coating having an average thickness of 0.50–10.0 μm.

2. A hard multilayer coated tool according to claim 1, wherein said each of said first coating layers has a composition represented by $(Al_X Ti_{1-X})(N_Y C_{1-Y})$ wherein $0.05 \leq X \leq 0.50$, $0.50 \leq Y \leq 1.00$, while said each of said second coating layers has a composition represented by $(Al_Z Ti_{1-Z})(N_T C_{1-T})$ wherein $0.50 < Z \leq 0.80$, $0.50 \leq T \leq 1.00$.

3. A hard multilayer coated tool to claim 2, wherein said multilayer coating satisfies the following expression:

$$(Xl_1 + Zl_2)/(l_1 + l_2) > 0.5;$$

where X and Z represent a mixing ratio of aluminum in said respective first and second coating layers;

$l_1$ represents average thickness of said first coating layer; and $l_2$ represents average thickness of said second coating layer.

4. A hard multilayer coated tool according to claim 3, wherein one of said first coating layers constitutes an innermost layer of said multilayer coating, and one of said second coating layers constitutes an outermost layer of said multilayer coating which is remote from said substrate.

5. A hard multilayer coated tool according to claim 1, wherein said each of said first coating layers has a composition represented by Ti $(N_x C_{1-x})$ wherein $0.50 \leq x \leq 1.00$, while said each of said second coating layers has a composition represented by $(Al_y Ti_{1-y})(N_z C_{1-z})$ wherein $0.20 \leq y \leq 0.80$, $0.50 \leq z \leq 1.00$.

6. A hard multilayer coated tool according to claim 5, wherein said average thickness of said each of said first coating layers is 0.10–0.40 μm and said average thickness of said each of said second coating layers is 0.10–0.40 μm.

7. A hard multilayer coated tool according to claim 6, wherein one of said first coating layers constitutes an innermost layer of said multilayer coating, and one of said second coating layers constitutes an outermost layer of said multilayer coating which is remote from said substrate.

8. A hard multilayer coated tool according to claim 1, further comprising an interface layer which contains titanium therein and which is interposed between said substrate and said multilayer coating.

9. A hard multilayer coated tool according to claim 1, further comprising a surface layer which contains aluminum therein and which is superposed on an outer surface of said multilayer coating.

10. A hard multilayer coated tool according to claim 1, wherein said multilayer coating further comprises intermediate coating layers each of which is interposed between said first and second coating layers, and each of which has an average thickness of 0.10–0.50 μm and contains aluminum therein, an aluminum content in said each of said intermediate coating layers being larger than that in said each of said first coating layers and smaller than that in said each of said second coating layers.

11. A hard multilayer coated tool according to claim 10, wherein said each of said first coating layers has a composition represented by $(Al_X Ti_{1-X})(N_Y C_{1-Y})$ wherein $0.05 \leq X \leq 0.50$, $0.50 \leq Y \leq 1.00$, said each of said second coating layers having a composition represented by $(Al_Z Ti_{1-Z})(N_T C_{1-T})$ wherein $0.50 \leq Z \leq 0.80$, $0.50 \leq T \leq 1.00$, said each of said intermediate coating layers having a composition represented by $(Al_U Ti_{1-U})(N_V C_{1-V})$ wherein $X < U < Z$, $0.50 \leq V \leq 1.00$.

12. A hard multilayer coated tool according to claim 11, wherein said multilayer coating satisfies the following expression:

$$(Xl_1 + Zl_2 + 2Ul_3)/(l_1 + l_2 + 2l_3) > 0.5;$$

where X, Z and U represent a mixing ratio of aluminum in said respective first, second and intermediate coating layers;

$l_1$ represents average thickness of said first coating layer;

$l_2$ represents average thickness of said second coating layer; and $l_3$ represents average thickness of said intermediate coating layer.

13. A hard multilayer coated tool according to claim 12, wherein one of said first coating layers constitutes an innermost layer of said multilayer coating, and one of said coating layers other than said first coating layers constitutes an outermost layer of said multilayer coating which is remote from said substrate.

14. A hard multilayer coated tool according to claim 10, wherein said each of said first coating layers has a composition represented by Ti $(N_s C_{1-s})$ wherein $0.50 \leq s \leq 1.00$, said each of said second coating layers having a composition represented by $(Al_t Ti_{1-t})(N_u C_{1-u})$ wherein $0.50 < t \leq 0.80$, $0.50 \leq u \leq 1.00$, said each of said intermediate coating layers having a composition represented by $(Al_v Ti_{1-v})(N_w C_{1-w})$ wherein $0.20 \leq v < 0.50$, $0.50 w \leq 1.00$.

15. A hard multilayer coated tool according to claim 14, wherein said average thickness of said each of said first coating layers is 0.10–0.40 μm, wherein said average thickness of said each of said second coating layers is 0.10–0.40 μm, and wherein said average thickness of said each of said intermediate coating layers is 0.10–0.20 μm.

16. A hard multilayer coated tool according to claim 15, wherein one of said first coating layers constitutes an innermost layer of said multilayer coating, and one of said coating layers other than said first coating layers constitutes an outermost layer of said multilayer coating which is remote from said substrate.

17. A hard multilayer coated tool according to claim 16 wherein each two of said intermediate coating layers and a corresponding one of said second layers cooperate to have a thickness whose average is equal to or less than 0.50 μm, said each two of said intermediate coating layers being adjacent to each other, and said corresponding one of said second layers being interposed between said each two of said intermediate coating layers.

18. A hard multilayer coated tool according to claim 10, further comprising an interface layer which contains titanium therein and which is interposed between said substrate and said multilayer coating.

19. A hard multilayer coated tool according to claim 10, further comprising a surface layer which contains aluminum therein and which is superposed on an outer surface of said multilayer coating.

* * * * *